(12) United States Patent
Niemann et al.

(10) Patent No.: US 6,204,647 B1
(45) Date of Patent: Mar. 20, 2001

(54) BATTERY EMULATING POWER SUPPLY

(75) Inventors: James A. Niemann, Aurora; Wayne Goeke, Hudson; Kevin Cawley, Sagamore Hills, all of OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 09/324,153

(22) Filed: Jun. 2, 1999

(51) Int. Cl.[7] .............................. G05F 1/40; G01R 31/12; G06G 7/12
(52) U.S. Cl. ...................... 323/282; 324/548; 327/563
(58) Field of Search ..................................... 323/282, 283, 323/284, 288, 866; 363/17, 21; 324/546, 547, 548; 327/180, 563

(56) References Cited

U.S. PATENT DOCUMENTS 5,677,634 * 10/1997 Cooke et al. ..................... 324/548

* cited by examiner

*Primary Examiner*—Peter S. Wong
*Assistant Examiner*—Rajnikant B. Patel
(74) *Attorney, Agent, or Firm*—Pearne & Gordon LLP

(57) ABSTRACT

A power supply is provided with independently adjustable voltage and current sources to provide a power supply having a desired voltage-current relationship to a device under test. This allows the control of the power supply output impedance as seen by the device under test and the emulation of a battery or other power supply having particular voltage-current relationships.

6 Claims, 1 Drawing Sheet

FIG. 1
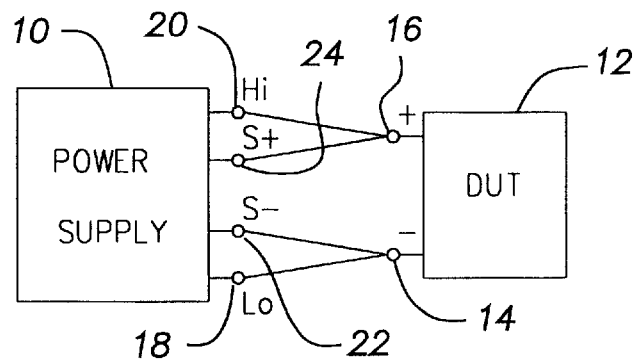
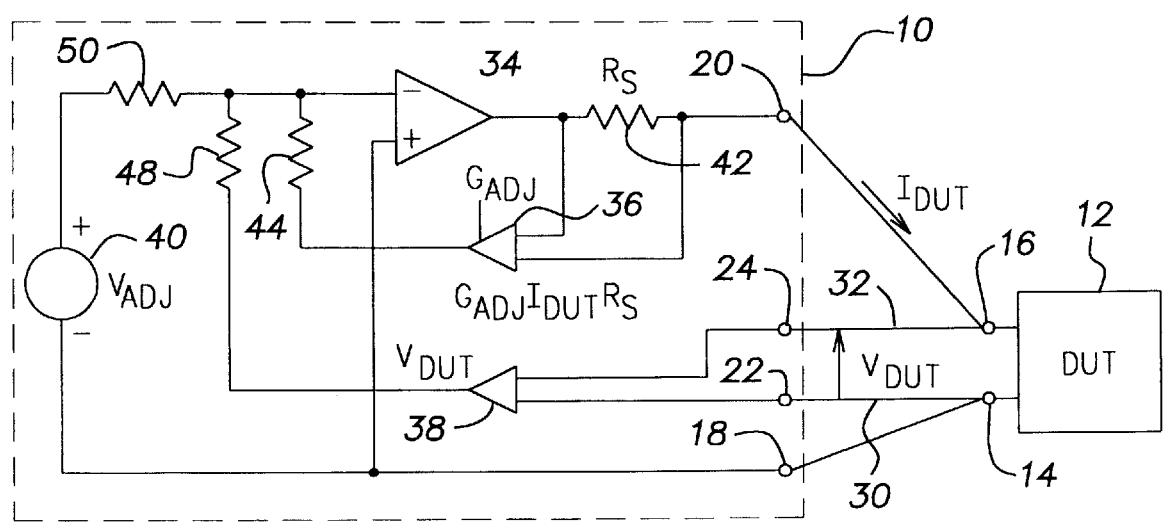
FIG. 2

BATTERY EMULATING POWER SUPPLY

BACKGROUND OF THE INVENTION

The present invention relates to direct current power supplies and in particular to a power supply that emulates the characteristics of a battery.

An "ideal" power supply is normally defined as having zero impedance. Typically, power supplies are designed with an output impedance as close to zero as is practically possible or economically acceptable. A battery power source will not have a zero impedance and will, in fact, have an impedance that varies with, among other parameters, shelf-life and usage.

A manufacturer of a battery-powered device (e.g., a cellular phone) often will desire to test the device in operation without using a battery. To fully test the device with a power supply as the power source instead of a battery, it is desirable to emulate the voltage-current relationship exhibited by the battery.

In addition, as the power supply will typically be located remotely with respect to the device, it becomes important to be able to control the voltage-current relationship exhibited at the device as opposed to being exhibited at the power supply. For example, the voltage drop caused by the resistance of test leads will alter the voltage-current relationship at the device.

SUMMARY OF THE INVENTION

A power supply for providing a desired output impedance and a desired voltage or a desired current to a device under test (DUT) includes a DUT current sensing circuit, an operational amplifier having an inverting and a non-inverting input and an output, a DUT voltage sensing circuit, and an adjustable voltage source. The current sensing circuit provides a DUT current signal. The operational amplifier output is connectable to the non-inverting input through the current sensing circuit and the DUT. The DUT current signal is communicated to the inverting input. The voltage sensing circuit provides a DUT voltage signal that is communicated to the inverting input. The voltage source communicates with the inverting input. The power supply provides the desired output impedance and the desired voltage or the desired current to the DUT.

BRIEF DESCRIPTION OF THE DRAWINGS

FIG. 1 is a block diagram of a power supply according to the invention.

FIG. 2 is a schematic diagram of a power supply according to the invention.

DESCRIPTION OF THE PREFERRED EMBODIMENTS

Referring to FIG. 1, a power supply 10 is connected to a DUT 12. The DUT 12 includes a negative power terminal 14 and a positive power terminal 16. The power supply 10 includes an output terminal 18 (Low) and an output terminal 20 (High, typically, at a more positive potential than Low). The power supply 10 also includes an input terminal 22 (Sense⁻) and an input terminal 24 (Sense⁺). During operation, the terminals 20, 24 are connected at the terminal 16 and the terminals 18, 22 are connected at the terminal 14.

Referring to FIG. 2, a preferred embodiment of the power supply 10 includes an operational amplifier 34, an adjustable gain high-impedance amplifier 36, a high-impedance buffer amplifier 38, an adjustable voltage source 40 and a current-sensing resistor 42.

The operational amplifier 34 has an output, an inverting input, a non-inverting input and a gain very much greater than one. The operational amplifier 34 may be, for example, a prepackaged integrated circuit operational amplifier having an inverting input and a non-inverting input; a combination of discrete devices such as a high gain (gain much greater than one) amplifier provided with inputs from the output of a buffer amplifier and the output of an inverting amplifier, the input to the buffer amplifier being the non-inverting input and the input to the inverting amplifier being the inverting input; or, in general, any combination of components that provide a high gain output from the difference between two inputs. It is also possible to pre-invert one of inputs in order to provide the effect of a difference while instead forming the sum of the inputs.

The amplifiers 36, 38 have an input impedance sufficient to ensure that the current through the resistor 42 during operation is essentially equal to the current $I_{DUT}$ through the DUT 12. The gain $G_{ADJ}$ of the amplifier 36 is adjustable to provide an output voltage equal to $G_{ADJ}I_{DUT}R_S$, where $R_S$ is the resistance of the resistor 42 (note that the value of the resistance $R_S$ could also be varied). The voltage source 40 has an adjustable output voltage $V_{ADJ}$.

The output of the amplifier 34 is connected through the resistor 42 to the terminal 20. The voltage across the resistor 42 is connected to the input of the amplifier 36 and the output of the amplifier 36 is connected through the resistor 44 to the inverting input of the amplifier 34. The terminal 18 is connected to the non-inverting input of the amplifier 34. The terminals 22, 24 are connected to respective input terminals of the amplifier 38 and the output of the amplifier 38 is connected through the resistor 48 to the inverting input of the amplifier 34. The minus terminal of the voltage source 40 is connected to the non-inverting input of the amplifier 34 and the positive terminal is connected through the resistor 50 to the inverting input of the amplifier 34. The resistors 44, 48, 50 may be, for example, 10,000 ohms.

In order to eliminate the effect of any resistance between the amplifier 34 and the DUT 12 (other than $R_S$), the terminals 22, 24 are connectable by the conductors 30, 32 at or near the terminals 14, 16. This avoids the effect of any IR drop caused by $I_{DUT}$ in the leads between the terminals 18, 20 and the terminals 14, 16, respectively.

In operation, the gain $G_{ADJ}$ and the voltage $V_{ADJ}$ are adjusted until the desired resistance $R_O$ and voltage $V_{DUT}$ or current $I_{DUT}$ are produced. In this embodiment, $R_O$ has a value of $G_{ADJ}R_S$. This value follows directly from Thevenin's Theorem which states that $R_O$ is the quotient of the open circuit voltage and the short circuit current of the power supply 10. The adjustment of $R_O$ and $V_{DUT}$ or $I_{DUT}$ could be performed manually, but in the preferred embodiment the adjustments would be made in response to control signals to the voltage source 40 and the amplifier 36 from an unshown controller such as a microcontroller or general purpose computer.

One skilled in the art will appreciate that the active devices of the power supply 10 employ unshown power sources for their operation and that, in controlling the operation of the power supply 10, unshown circuitry to monitor and control the values of $I_{DUT}$, $V_{ADJ}$, $G_{ADJ}$ are used. Such power sources and circuitry are well within the skill of one skilled in the art.

The invention allows a desired output impedance and either a desired voltage or a desired current to be provided by the power supply 10 to the DUT 12. By this manipulation of the voltage-current relationships of the power supply 10, the characteristics of a battery may be emulated, this emulation includes, but is not limited to, the characteristics as the battery discharges, the characteristics as the battery ages, and the characteristics of the battery at different temperatures. The invention is suitable for emulating other power sources as well, for example, inexpensive low power ac adapters that exhibit relatively high output impedances.

In addition, it should be noted that the invention may be advantageously located remotely from the DUT because test lead impedance does not effect the operation of the power supply as seen by the DUT. This can be particularly advantageous where testing of the DUT is occurring on an assembly line where locating the power supply near the DUT may be difficult or impossible.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A power supply for providing a desired output impedance and one of a desired voltage and a desired current to a device under test (DUT), said supply comprising:

a DUT current sensing circuit, said current sensing circuit providing a DUT current signal;

an operational amplifier having an inverting and a non-inverting input and an output, said output being connectable to said non-inverting input through said current sensing circuit and said DUT, said DUT current signal being adjustably communicated to said inverting input;

a DUT voltage sensing circuit, said voltage sensing circuit providing a DUT voltage signal, said DUT voltage signal being communicated to said inverting input; and an adjustable voltage source, said voltage source communicating with said inverting input, said power supply providing said desired output impedance and said one of said desired voltage and said desired current to said DUT in response to adjustment of said adjustable communication and said adjustable voltage source.

2. A power supply according to claim 1, wherein said DUT current sensing circuit includes a sensing resistor in series with said DUT.

3. A power supply according to claim 1, wherein said DUT voltage sensing circuit is separately connectable to said DUT.

4. A battery emulating power supply for providing a desired output impedance and one of a desired voltage and a desired current to a device under test (DUT), said supply comprising:

a DUT current sensing circuit, said current sensing circuit providing a DUT current signal;

an operational amplifier having an inverting and a non-inverting input and an output, said output being connectable to said non-inverting input through said current sensing circuit and said DUT, said DUT current signal being adjustably communicated to said inverting input;

a DUT voltage sensing circuit, said voltage sensing circuit providing a DUT voltage signal, said DUT voltage signal being communicated to said inverting input; and an adjustable voltage source, said voltage source communicating with said inverting input, said power supply providing said desired output impedance and said one of said desired voltage and said desired current to said DUT in response to adjustment of said adjustable communication and said adjustable voltage source to emulate a battery.

5. A power supply according to claim 4, wherein said DUT current sensing circuit includes a sensing resistor in series with said DUT.

6. A power supply according to claim 4, wherein said DUT voltage sensing circuit is separately connectable to said DUT.

* * * * *

UNITED STATES PATENT AND TRADEMARK OFFICE
CERTIFICATE OF CORRECTION

PATENT NO. : 6,204,647 B1
DATED : March 20, 2001
INVENTOR(S) : James A. Niemann, et al.

Page 1 of 1

It is certified that error appears in the above-identified patent and that said Letters Patent is hereby corrected as shown below:

Column 2,
Lines 47 and 50, delete "$R_o.$" and insert therefore -- $R_o$ --.
Line 62, after "$I_{DUT}$," insert -- $V_{DUT}$, --.

Signed and Sealed this

Twenty-third Day of October, 2001

*Attest:*

NICHOLAS P. GODICI
*Attesting Officer*     *Acting Director of the United States Patent and Trademark Office*